(12) United States Patent
Johnson et al.

(10) Patent No.: US 6,678,300 B2
(45) Date of Patent: Jan. 13, 2004

(54) COUPLED CAVITY ANTI-GUIDED VERTICAL-CAVITY SURFACE-EMITTING LASER

(75) Inventors: Ralph Herbert Johnson, Murphy, TX (US); James Gunter, Garland, TX (US); Andrew Clark, Richardson, TX (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/147,136

(22) Filed: May 13, 2002

(65) Prior Publication Data

US 2002/0163950 A1 Nov. 7, 2002

Related U.S. Application Data

(63) Continuation of application No. 09/387,424, filed on Aug. 31, 1999, now Pat. No. 6,411,638.

(51) Int. Cl.$^7$ .................................................. H01S 5/00
(52) U.S. Cl. ............................ 372/46; 372/45; 372/50; 372/96; 438/22; 257/98
(58) Field of Search ............................ 372/45, 46, 50, 372/96; 438/22; 257/98

(56) References Cited

U.S. PATENT DOCUMENTS

| | | | | |
|---|---|---|---|---|
| 5,249,195 | A | * 9/1993 | Feldman et al. | 372/45 |
| 5,283,795 | A | * 2/1994 | Fink | 372/32 |
| 5,388,120 | A | 2/1995 | Ackley et al. | |
| 5,493,577 | A | * 2/1996 | Choquette et al. | 372/45 |
| 5,838,715 | A | * 11/1998 | Corzine et al. | 372/101 |
| 5,903,588 | A | 5/1999 | Guenter et al. | |
| 6,185,241 | B1 | * 2/2001 | Sun | 372/46 |
| 6,268,921 | B1 | * 7/2001 | Seitz et al. | 356/407 |
| 6,411,638 | B1 | * 6/2002 | Johnson et al. | 257/98 |

FOREIGN PATENT DOCUMENTS

| | | |
|---|---|---|
| EP | 0898344 | 2/1999 |
| EP | 0944143 A4 | 9/1999 |
| EP | 0944143 A1 | 9/1999 |
| WO | WO 99/18641 | 4/1999 |

OTHER PUBLICATIONS

T. H. Oh et al., "Cavity–Induced Antiguiding in a Selectively Oxidized Vertical–Cavity Surface–Emitting Laser", IEEE Photonics Technology Letters, Jan. 1998, pp. 12–14.

(List continued on next page.)

*Primary Examiner*—Paul Ip
*Assistant Examiner*—Delma R. Flores Ruiz
(74) *Attorney, Agent, or Firm*—Crompton, Seagers & Tufte; Andrew A Abeyta

(57) ABSTRACT

A laser structure (10, 60) and method of manufacturing a vertical-cavity surface-emitting laser (VCSEL). The laser structure (10, 60) is adapted to lase at a wavelength lambda and includes a first mirror stack (14), an active region (18) disposed on the first mirror stack (14) and a second mirror stack (22) disposed on the active region (18). The second mirror stack (22) includes a plurality of alternating mirror layer pairs (a, b) with a phase shifting region (24) disposed therein. The phase shifting region (24) is positioned outside the optical aperture (25) and away from the active region (18) by at least one mirror layer pair, with the optical thickness of the phase shifting region (24) being a multiple of one-fourth lambda, the phase shifting region (24) being oxidized reducing the reflectance of the second mirror stack (22) outside the aperture relative to inside the aperture. The optical thickness of the phase shifting region (24) is a function of the difference between the index of refraction of an adjacent semiconductor layer and the index of refraction of the phase shifting region. The phase shifting region (24) creates a coupled cavity (25, 68) positioned above the active region (18). The phase shifting region (24) reduces the reflectance of the second mirror stack (22) and may be positioned at a node of the laser electric field inside the aperture.

26 Claims, 3 Drawing Sheets

OTHER PUBLICATIONS

T. H. Oh et al., "Single–Mode Operation in an Antiguided Vertical–Cavity Surface–Emitting Laser Using a Low–Temperature Grown AlGaAs Dielectric Aperture", IEEE Photonics Technology Letters, Aug. 1998, pp. 1064–1066.

Y. A. Wu et al., "Single–Mode Passive Antiguide Vertical Cavity Surface Emitting Laser", IEEE Journal of Selected Topics in Quantum Electronics, Jun. 1995, pp. 629–637.

Y. Z. Huang, Effect of Reflectivity at the Interface of Oxide Layer on Transverse Mode Control in Oxide Confined Vertical–Cavity Surface–Emitting Lasers:, Journal of Applied Physics, Apr. 1998, pp. 3769–3772.

M. Grabherr et al., "Efficient Single–Mode Oxide–Confined GaAs VCSELs Emitting in the 850–nm Wavelength Regime", IEEE Photonics Technology Letters, Oct. 1997, pp. 1304–1306.

Coldren, et al., "Dielectric Apertures as Intracavity Lenses in Vertical–Cavity Lasers", Appl. Phys. Letter., vol. 68, No. 3, Jan. 15, 1996, pp. 313–315.

Jewell, et al., Vertical–Cavity Surface–Emitting Lasers: Design, Growth, Fabrication, Characterization, IEEE Journal of Quantum Electronics, vol. 27., No. 6, Jun. 1991, pp. 1332–1346.

Tatus, et al., "High Speed Characteristics of VCSELs" Micro Switch Sensing and Control, pp. 1–9.

"Honeywell VCSEL Optical Characteristics" Honeywell Web Site, Copyright 1998–1999, Honeywell Inc.

PCT International Serach Report, Jan. 17, 2001, International Application No. PCT/US00/23499. (Not Included).

* cited by examiner

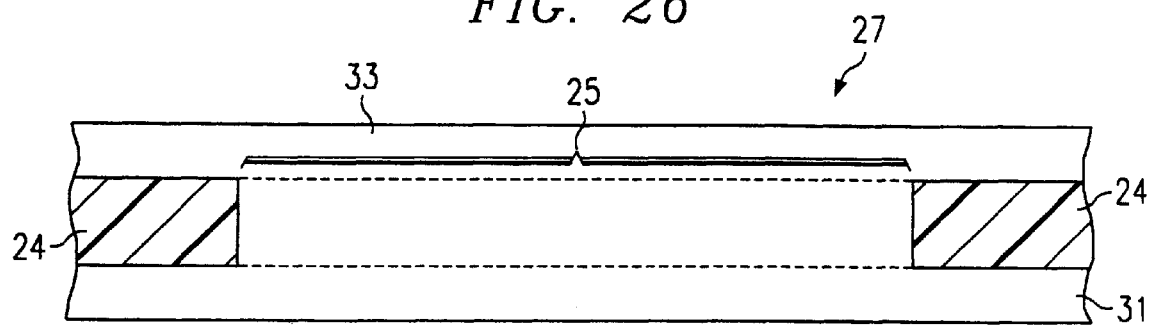
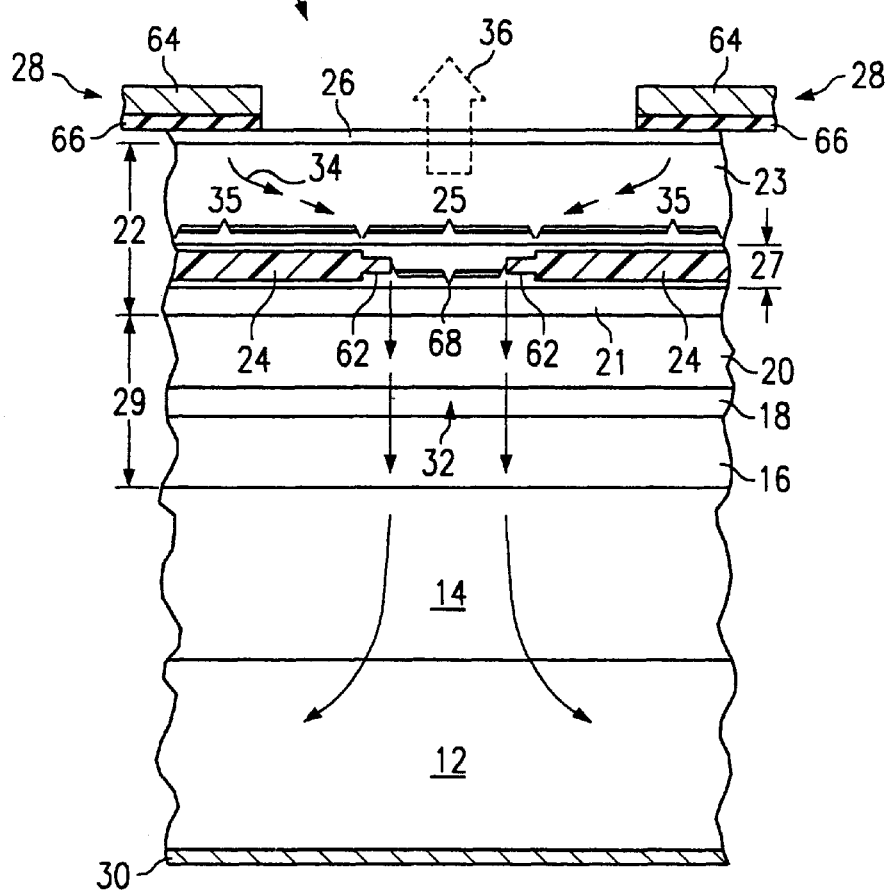

COUPLED CAVITY ANTI-GUIDED VERTICAL-CAVITY SURFACE-EMITTING LASER

This is a continuation of application Ser. No. 09/387,424 filed on Aug. 31, 1999 now U.S. Pat. No. 6,411,638, entitled "Coupled Activity Anti-Guided Vertical-Cavity Surface Emitting Laser."

FIELD OF THE INVENTION

The present invention generally relates to semiconductor lasers, and more particularly, to a laser structure and method for manufacturing a single transverse mode Vertical-Cavity Surface-Emitting Laser (VCSEL).

BACKGROUND OF THE INVENTION

Various schemes for producing semiconductor diode lasers are known in the art. Conventional edge-emitting diode lasers comprise an optical cavity that is parallel to the surface of the wafer from which many laser dice (or chips) are produced from a wafer by sawing or cleaving. Laser radiation is extracted from the side of the die in an edge-emitting laser. Surface-emitting lasers, in contrast, emit radiation perpendicular to the semiconductor substrate plane, from the top or bottom of the die. A Vertical-Cavity Surface-Emitting Laser (VCSEL) is a surface-emitting laser having mirrors disposed parallel to the wafer surfaces that form and enclose an optical cavity between them. Recently there has been an increased interest in VCSELs because of their smaller size, higher performance, and ease of manufacturability when compared to edge-emitting lasers. VCSELs have proven useful for multi-mode operation, in particular, and for use in modern high speed, short wavelength communication systems.

VCSELs usually have a substrate upon which a first mirror stack and second mirror stack is disposed, with a quantum well active region therebetween. Gain per pass is much lower with a VCSEL than an edge-emitting laser, which necessitates better mirror reflectivity. For this reason, the mirror stacks in a VCSEL typically comprise a plurality of Distributed Bragg Reflector (DBR) mirrors, which may have a reflectivity of 99.7% or higher. An electrical contact is positioned on the second mirror stack, and another contact is provided at the opposite end in contact with the substrate. When an electrical current is induced to flow between the two contacts, lasing is induced from the active region and emits through either the top or bottom surface of the VCSEL.

VCSELs may be broadly categorized into multi-transverse mode and single transverse mode, each category being advantageous in different circumstances. A goal in manufacturing single-mode VCSELs is to assume single-mode behavior over all operating conditions, without compromising other performance characteristics. Generally, the active regions of single transverse mode VCSELs require small lateral dimensions, which tend to increase the series resistance and beam divergence angle. Furthermore, a device that is single-mode at one operating condition can become multi-mode at another operating condition, an effect that dramatically increases the spectral width and the beam divergence of the emitted radiation of the VCSEL.

Manufacturing a VCSEL with good mode control and high performance characteristics poses a challenge. It is difficult to manufacture VCSELs that efficiently operate in the lowest order mode (single mode). Most prior art VCSELs tend to lase in higher-order transverse modes, whereas single transverse mode lasing is preferred for some applications, such as sensors.

In the June 1991 issue of IEEE Journal of Quantum Electronics, Vol. 27, No. 6, in an article entitled, "Vertical-Cavity Surface-Emitting Lasers: Design, Growth, Fabrication, Characterization," Jewell et al. discuss design issues, molecular beam epitaxial (MBE) growth, fabrication and lasing characteristics of VCSELs in general.

In the August, 1998 publication of IEEE Photonics Technology Letters, Vol. 10, No. 8, in article entitled "Single-Mode Operation in an Antiguided Vertical-Cavity Surface Emitting Laser Using a Low-temperature Grown AlGaAs Dielectric Aperture," Oh et al. discuss using a low-temperature growth of a highly resistive AlGaAs dielectric aperture. A reduced regrowth temperature is required to obtain smooth boundaries over the aperture perimeter.

U.S. Pat. No. 5,903,588, "Laser with a Selectively Changed Current Confining Layer," which issued to Guenter et al. on May 11, 1999, discloses a laser structure with two current confining layers of a material that is subject to oxidation in the presence of an oxidizing agent. Unoxidized layer portions are surrounded by oxidized and electrically resistive ports in order to direct current from one electrical contact pad by passing through a pre-selected portion of an active region of the laser.

In the June 1995 issue of the IEEE Journal of Selected Topics in Quantum Electronics, Vol. 1, No. 2, in an article entitled "Single-Mode, Passive Antiguide Vertical Cavity Surface Emitting Laser," We et al. discuss using a passive antiguide region surrounding the active region to achieve a single stable mode at high currents. This design is disadvantageous because a mesa structure is formed, and then material must be regrown around the side, while maintaining single crystal characteristics.

In the October 1997 issue of the IEEE Photonics Technology Letters, Vol. 9, No. 10, in an article entitled "Efficient Single-Mode Oxide-Confined GaAs VCSELs Emitting in the 850-nm Wavelength Regime", Grabherr et al. disclose a single mode oxide-confined VCSEL. An oxidized current aperture is placed adjacent the active region of the VCSEL.

In the Apr. 1, 1998 publication of the Journal of Applied Physics, Vol. 83, No. 7, in an article entitled "Effect of Reflectivity at the Interface of Oxide Layer on Transverse Mode Control in Oxide Confined Vertical-Cavity Surface-Emitting Lasers," Huang demonstrates transverse mode control by modeling the dielectric aperture as a uniform waveguide and an extra reflectivity at the oxide layer. Huang shows that replacing the first layer of the DBR with a ¾ wavelength layer immediately adjacent the optical cavity, and inserting an oxide layer inside the ¾ wave layer, results in a low refractive index step and lower threshold current.

Usually, to manufacture a VCSEL, a relatively large current aperture size is required to achieve a low series resistance and high power output. A problem with a large current aperture is that higher order lasing modes are introduced so that single mode lasing only occurs just above threshold, if at all. Manufacturing a VCSEL with a smaller current aperture to more reliably obtain single mode behavior causes multiple problems: the series resistance and beam divergence angle become large, and the attainable power becomes small Anti-guide structures of the prior art prevent some of these disadvantages, but suffer from manufacturing difficulties, particularly in requiring an interruption in epitaxial growth, a patterning step, and subsequent additional epitaxy. Other large single mode VCSELs require multi-step MBE or MBE/MOCVD combinations to manufacture, creating alignment and yield problems.

What is needed in the art is a VCSEL with improved mode control and ease of manufacturing, with as large as possible an aperture, to minimize the series resistance and beam divergence.

SUMMARY OF THE INVENTION

The present invention achieves technical advantages as a VCSEL designed for single mode operation whereby a phase shifting region, which creates a coupled cavity, is disposed within one mirror stack. The coupled cavity decreases reflectance as seen from the active region. This phase shifting region is disposed nominally outside the optical aperture. The resultant reflectance increases losses for higher order modes relative to the fundamental mode because higher order modes have a larger spatial extent. Centering the phase shifting region at a node of the optical electric field of the VCSEL maximizes the losses for higher order modes relative to the fundamental mode. In addition to the enhanced losses the present invention also creates an antiguide.

According to a first embodiment, disclosed is a laser structure adapted to lase at a wavelength lambda. The laser structure includes a first mirror stack, an active region disposed on the first mirror stack, and a second mirror stack disposed on the active region. The second mirror stack includes a plurality of mirror layer pairs with a resonant layer having a phase shifting region about a current aperture disposed therein outside of the quantum well layers of the active region. The phase shifting region creates a coupled cavity positioned outside the optical aperture and is positioned at least one mirror period above the active region. The optical thickness of the phase shifting region is preferably an odd integral multiple of one-fourth lambda different from the parallel optical path length inside the current aperture. At the operating wavelength the reflectance of the second mirror stack outside the optical aperture is reduced with the present invention.

Also disclosed is a laser structure adapted to lase at a wavelength lambda, including a first mirror stack, an active region disposed on the first mirror stack, and a second mirror stack disposed on the active region. The second mirror stack includes a plurality of semiconductor layers, and has a resonant layer with a phase shifting region disposed therein nominally outside an optical aperture. The phase shifting region creates a coupled cavity positioned vertically near the active layers, but outside the optical aperture. At least one of the plurality of semiconductor layers is disposed between the phase shifting region and the active region, and the phase shifting region has a lower index of refraction than the adjacent semiconductor layers proximate the active region. The thickness of the phase shifting region is a function of one-fourth Lambda and a function of the difference between the index of refraction of the adjacent semiconductor layer and the index of refraction of the phase shifting region.

Also disclosed is a vertical cavity surface emitting laser (VCSEL) adapted to lase at a wavelength lambda. The VCSEL has a first semiconductor mirror stack, an active region disposed on the first semiconductor mirror stack, and a second semiconductor mirror stack disposed on the active region. The second semiconductor mirror stack has a plurality of semiconductor mirror layer pairs, with a phase shifting region disposed therein about a current aperture. The phase shifting creates a coupled cavity positioned near but spaced from the active region. The phase shifting region is positioned such that reflectance of the second mirror stack is reduced nominally outside the optical aperture, and has a thickness defined by the formula:

$$d = \frac{(1+2j)*\lambda}{(n_{semi} - n_{oxide})*4}$$

wherein d is the phase shifting region thickness, j is an integer, $n_{semi}$ is the index of refraction of the horizontally adjacent semiconductor layer to the phase shifting region at the lasing wavelength $\lambda$, and $n_{oxide}$ is the index of refraction of the phase shifting region at the lasing wavelength $\lambda$.

Further disclosed is a method for manufacturing a vertical-cavity surface emitting laser (VCSEL). The method includes the steps of providing a first semiconductor mirror stack, forming an active region upon the first semiconductor mirror stack, and forming a first portion of a second semiconductor mirror stack above the active region. The first portion of the second semiconductor mirror stack has at least one mirror layer pair. Also included are the steps of forming a phase shifting region disposed about a current aperture above the first portion of the second semiconductor mirror stack, the phase shifting region and the mirror regions above and below the phase shifting region forming a coupled cavity, and thereafter, a second portion of a second semiconductor mirror stack is formed above the phase shifting region.

Advantages of the invention include reducing reflectance of the second semiconductor mirror stack in the coupled region, which causes losses for higher order modes, enhancing single mode performance of the laser. The phase shifting region of the present invention may be created by forming an oxide layer using single step MOCVD, combined with an oxidation step, improving manufacturability and increasing yields.

BRIEF DESCRIPTION OF THE DRAWINGS

The above features of the present invention will be more clearly understood from consideration of the following descriptions in connection with accompanying drawings in which:

FIG. 2b shows a detailed cross-sectional view of the phase shifting region within the resonant layer of the second mirror stack;

FIG. 4 is a cross-sectional view of a second embodiment of the present invention wherein the phase shifting region has inwardly extending protrusions into the optical aperture to create a smaller current aperture and confine current.

DESCRIPTION OF THE PREFERRED EMBODIMENTS

A prior art method of producing single-mode VCSELs involves oxidizing an aluminum-bearing layer or layers within the VCSEL structure adjacent the optical cavity, creating an insulating region surrounding an aperture through which current may flow. The insulating region alters the reflectivity of the mirrors disposed about the optical cavity, which may improve or detract from the intended single-mode performance. If the oxide is thin and placed at a node of the optical electric field, then it has little optical effect. By using the oxide to make the current aperture small in diameter, the smaller sized fundamental mode can be selected over the larger sized higher order modes because the optical gain inside the current aperture overlaps the smaller fundamental mode more than the larger higher order modes. As the size is increased, the selectivity disappears and higher order modes become more prevalent. Using this method, single mode devices of only a few microns in diameter have been created, which have large beam angles and high resistance because of their small sizes. As an even worse case, using an oxide thickness, which enhances reflectivity outside the current aperture, actually encourages lasing outside the aperture, selecting higher order modes over the fundamental mode.

Figure 1:
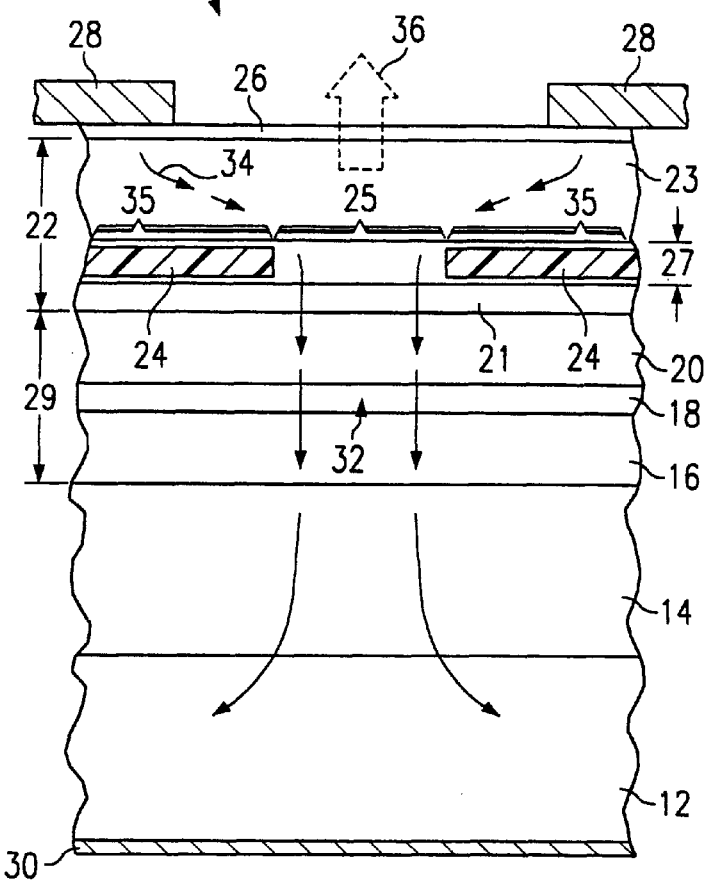
FIG. 1 illustrates a cross-sectional view of a first embodiment of the present invention, a VCSEL having a resonant layer with a phase shifting region which provides current confinement and creates a coupled cavity from the second mirror stack.

The present invention provides a single mode VCSEL having improved performance and greater ease of manufacturing. Referring first to FIG. 1, therein is shown a cross-sectional view of a VCSEL 10 in accordance with a first embodiment of the present invention. A substrate 12, preferably comprising GaAs, but possibly comprising other suitable materials, is provided, and a first semiconductor mirror stack 14 is disposed on the substrate 12. The substrate 12 may comprise, for example, an n-type substrate doped at $10^{18}/cm^3$. The bottom or first semiconductor mirror stack 14 comprises a plurality of mirror pairs of alternating low and high refractive indexes material, as is known in the art as DBR mirrors, and may be n-doped, for example. A first spacer layer 16 is disposed over the first semiconductor mirror stack 14, upon which an active region 18 is disposed. The active region 18 contains three GaAs quantum wells, which may be, for example, a middle 100 Å well of clad material such as $Al_{0.25}Ga_{0.75}As$ sandwiched between two 70 Å quantum wells. The active region 18 preferably has a thickness of less than $(\lambda/2n_{active})$, where lambda ($\lambda$) equals the desired operating lasing light wavelength and $n_{active}$ is the refractive index in the active region 18. A second spacer layer 20 is disposed over the active region 18. Both the first spacer layer 16 and the second spacer 20 may comprise a material such as $Al_{0.6}Ga_{0.4}As$, for example.

A first portion 21 of a second or top DBR semiconductor mirror stack 22 is disposed over the second spacer layer 20. The first portion 21 comprises at least one mirror pair, and may comprise several mirror layer pairs. A resonant layer 27, which may be $\lambda(1+2j)/4n_{semi}$ thick, where j is an integer and $n_{semi}$ is the index of refraction of layer 27, is disposed over the first portion 21 of the second semiconductor mirror stack 22. Layer 27 includes a central region having an optical aperture 25 located near the active region 18 but spaced above therefrom In the embodiment shown in FIG. 1, the optical aperture 25 is also the same diameter or area as, and defines, the current aperture. A phase shifting region 24 is defined around the perimeter of aperture 25 and forms a portion of layer 27. The material of phase shifting region 24 has a lower refractive index than the adjacent material and reduces the optical thickness of layer 27 in the vicinity of the partial layer formed by material 24 to approximately $m\lambda/4$ (where m is an odd integer), while leaving the mechanical thickness substantially unchanged. The optical thickness difference between aperture 25 and area 35 defined by region 24 induces a phase difference in the electric field standing wave pattern across these regions; thus, region 24 is referred to as a phase-shifting region. A second portion 23 of the second semiconductor mirror stack 22 is disposed over resonant layer 27, and a thin cap 26 of GaAs may be disposed over the second mirror stack 22. The second semiconductor mirror stack 22 comprises a plurality of mirror pairs of alternating low and high refractive indexes material, as is known in the art, and may be p-doped, for example.

The laser emission 36 from the VCSEL 10 results from a voltage applied across a top electrode 28, which is coupled to the thin cap 26, and a bottom electrode 30, which is coupled to the substrate 12. The voltage induces a current 34 to flow through the various layers of the VCSEL 10 to the substrate 12, as shown. A dielectric current-confining aperture 25 (which may be within region 24 or which could be disposed elsewhere in the structure) constrains current to flow in region 32, where laser emission is created and directed towards and through the top surface of the VCSEL 10. The aperture 25 is preferably annular, but may also be oval, square, rectangular, star-shaped, or any other shape, for example.

The present invention derives technical advantages whereby the phase-shifting region 24 disposed within the second semiconductor mirror stack 22 greatly reduces the reflectivity of the second mirror stack 22 in the phase-shifting region 24 region, and also causes high losses for higher order modes, creating more efficient single mode emission. The thickness and position of the phase-shifting region 24 within the second semiconductor stack 22 controls this effect. The thickness d of the phase-shifting region 24 is preferably defined by the equation:

$$d = \frac{\lambda * (1 + 2j)}{4 * (n_{semi} - n_{oxide})}$$

wherein d is the phase-shifting region thickness, j is an integer, $n_{semi}$ is the index of refraction of an adjacent semiconductor layer to the phase-shifting region, and $n_{oxide}$ is the index of refraction of the phase-shifting region. Because $n_{oxide}$ is frequently approximately equal to $n_{semi}/2$, the equation may be simplified to:

$$d = \frac{\lambda * (1 + 2j)}{2n_{semi}}$$

The phase-shifting region 24 is preferably ¼λ optical thickness, and less preferably, ¾λ optical thickness. The optimal position of the phase-shifting region 24 is centered at a null of the optical electric field in the semiconductor, to be discussed further herein.

Preferably, layer 27 is processed and formed using a single step MOCVD process. The formation of this layer is accomplished without removing the VCSEL 10 from the processing chamber, which minimizes problems arising from such removal and re-entry into the chamber. The phase-shifting region 24 is subsequently formed in a single oxidation process. The phase-shifting region 24 is preferably an oxide such as AlGa oxide, with the As being removed during the oxidation process, but may be any material having an index of refraction lower than the index of refraction of the lower index layer of the second mirror stack 22. However, a material with an index higher than the index of the lower index layer of the second mirror stack 22 may be used, if the phase-shifting region 24 is appropriately placed and the thicknesses adjusted to obtain ¼λ phase shift between region 25 and 35.

Figure 2A:
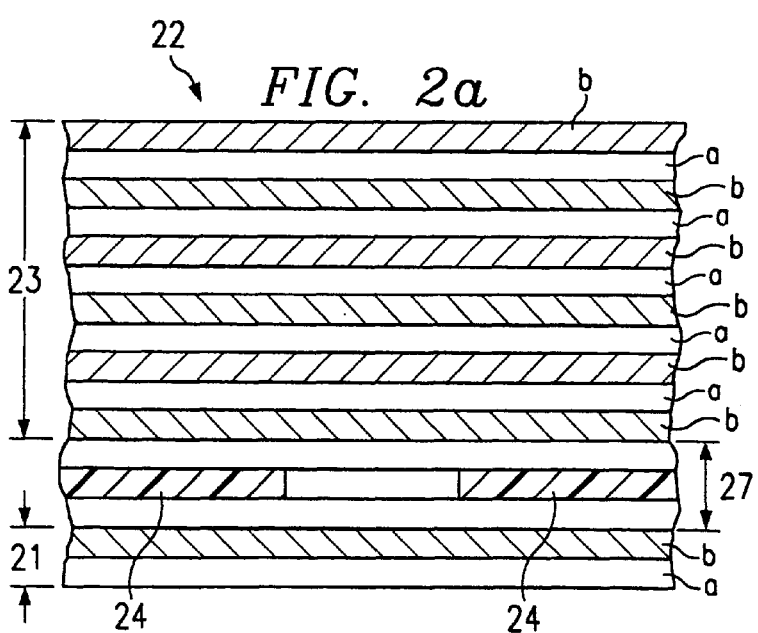
FIG. 2a shows a detailed cross-sectional view of the second mirror stack having a resonant layer with an integral phase shifting region.

FIG. 2a illustrates a more detailed view of the second semiconductor mirror stack 22 of FIG. 1 comprised of several layers of mirror pairs, each mirror pair comprising an "a" and "b" layer. Preferably, layer 27 is positioned above at least one pair of mirror layers "a" and "b" of first portion 21, as shown, and sometimes several mirror pairs. More preferably, layer 27 is positioned above 3 mirror periods of the first portion 21. Each layer "a" may be ¼λ of $Al_{0.9}Ga_{0.1}As$, and layer "b" may be ¼λ of $Al_{0.15}Ga_{0.85}As$, and approximately 600 Å thick, for example. To form the phase-shifting region 24, at the desired distance away from the active region 18 into the second semiconductor mirror stack 22, one of the low-index layers "a" is preferably epitaxially grown ¾ wavelength rather than ¼ wavelength, the thickness of the other "a" and "b" layers. This ¾λ layer has no significant effect on the reflectivity at the lasing wavelength. Subsequently, a peripheral portion of the ¾λ layer 27 is oxidized to an optical thickness of approximately ½λ to form phase shifting region 24, during which process the refractive index of the oxidized material decreases by approximately a factor of two. As a result, the optical thickness of the original ¾λ layer peripheral portion is reduced to ½λ in the vicinity of the phase-shifting region 24 of layer 27 (¼λ of unoxidized material and ½λ of semiconductor that is oxidized to ¼λ in region 24). For the stoichiometries discussed above, the phase-shifting region 24 may comprise ½λ of $Al_{0.97}Ga_{0.03}As$, for example, selectively oxidized in accordance with the present invention to ¼λ. With the present invention, a strong contrast between the reflectivities in the center versus the edges of the phase-shifting region 24 is achieved.

The material of the layer 27 remains ¾λ in optical thickness in the current conducting optical aperture 25. Note that the exact optical thickness of layer 24, embedded within layer 27, may not be exactly ½λ of semiconductor before oxidation and ¼λ after oxidation; rather, it may be adjusted based on material properties to assure there is a ¼ wavelength shift between the oxidized and unoxidized regions.

Additionally, the phase shift need not be λ/4. In other embodiments, the phase shift may range from λ/8 to 3λ/8 and still derive optical benefits of the present invention. For example, the oxidized layer may be a different thickness within the ¾ λ layer, such as λ/8 which would create a 45 degree phase shift. Preferably, the phase shift ranges from (λ/8 to 3λ/8)+λj/2, where j is an integer, to optimize the reduced reflectivity benefits of the present invention. While a 90 degree phase shift is obtained with the present invention, it is conceivable that other phase shifts, such as 60 degrees would be advantageous and attainable with the present invention.

Referring once again to FIG. 1, layers 16, 18, and 20 together, disposed between upper and lower mirrors, comprise a first Fabry-Perot cavity 29. The portion of layer 27 in the vicinity of phase-shifting region 24 having an optical thickness of ½λ and the adjacent ¾λ optical aperture 25 are disposed between mirror periods or mirror layer pairs above the cavity 29, and therefore layer 27 comprises a second Fabry-Perot cavity, with the same upper and lower mirrors but with differing optical thicknesses between the mirrors, inside and outside the optical aperture 25. With the optical thicknesses selected as described above, the interior portion of the Fabry-Perot cavity 27 coupled with the Fabry-Perot cavity 29 produces a very high reflectivity, in contrast to the perimeter portion, i.e. outside optical aperture 25. Contrarily, the Fabry-Perot cavity in the surrounding region of layer 27 with phase-shifting region 24, coupled with the cavity 29 produces a significantly lower reflectivity than the central portion inside 25. This very high reflectivity contrast due to the two differing sets of coupled cavities leads to the description of the resulting device as a coupled-cavity antiguiding VCSEL.

FIG. 2b illustrates an exploded view of resonant layer 27 of the present invention that is treated optically as though it were a single layer. Resonant layer 27 may comprise three layers, with the middle layer including the phase shifting region 24 and aperture 25. Bottom layer 31 and top layer 33 may comprise, for example, $Al_{0.90}Ga_{0.10}As$, while phase shifting region 24 may comprise $Al_{0.97}Ga_{0.03}As$. Either bottom layer 31 or top layer 33, but not both, are optional and may be of zero thickness. Preferably bottom layer 31 is of zero thickness. Also, resonant layer 27 is placed where an "a" layer (from FIG. 2a) would normally be located, although resonant layer 27 has a greater physical thickness than that of a regular "a" layer.

Figure 3:
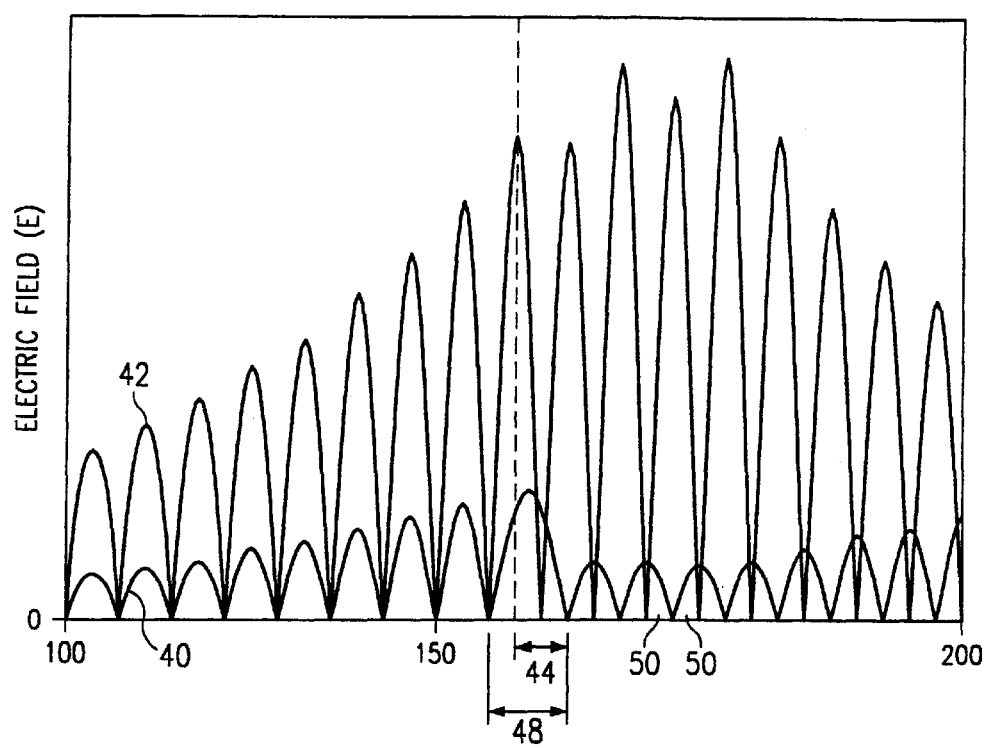
FIG. 3 shows results from an optical simulation of the resultant optical electric field both inside and outside the optical aperture of the VCSEL of the present invention from a light source directed into the top surface of the laser.

FIG. 3 shows a graph from an optical simulator analyzing the electric field intensities (y-axis) of the present invention generated from light incident the top surface through the various layers (x-axis) of the VCSEL 10. The electric fields 40 and 42 have peaks and valleys, with the electric field 42 of the light traveling through the aperture 25 having a higher intensity than the electric field 40 of the light traveling outside the aperture. A phase shift is demonstrated at region 44 of the graph, of the light outside the aperture, 40, after passing through the phase-shifting region 24 of the present invention with respect to the light inside 42 the aperture, depicted by region 48 of the graph. This phase shift causes increased losses of higher modes and reduces reflectivity. Region 48 demonstrates ½λ optical thickness in the path of light outside, 40, the aperture after passing through the phase-shifting region 24, as compared to ¾λ optical thickness in the path of light inside, 42, traveling through the aperture.

The optimal placement of the phase-shifting region 24 within the second semiconductor mirror stack 22 is centered at a null in the electric field, depicted at the center of region 44. Placing the phase-shifting region 24 within the second mirror stack 22 creates an optical disturbance, and placing the phase-shifting region at a null in the electric field minimizes the disturbance and still creates the desired reflectivity ratio. The optimal position of the phase-shifting region 24 is preferably relatively close to, but spaced from, the quantum wells, depicted in region 50. For example, the phase-shifting region 24 is preferably one to five mirror pairs ("a" and "b" from FIG. 2) away from the quantum wells 50 in the active region 18. Note that in the simulation graphically depicted in FIG. 3, light enters from the top of the VCSEL 10 (layer number 100 of the graph) and thus, the phase shift is noticed in the lower layers of the VCSEL 10. However, similarly, if the simulation involved shining light through the bottom of the wafer (layer number 200 of the graph), the phase shift would be noticed in the upper layers of the VCSEL 10. The phase-shifting region 24 of the present invention may be positioned within the top or bottom semiconductor mirror stack, or both, as required for the particular VCSEL 10 design, to produce a single mode laser.

FIG. 4 illustrates a cross-sectional view of a second embodiment of the present invention. The VCSEL 60 is similar functionally and structurally to the first embodiment VCSEL 10, wherein like numerals refer to like elements, with the addition of a laterally extending annular protrusion 62 centered along the edge of the phase-shifting region 24 and extending inwardly towards the current aperture 68. The protrusion 62 tightens the current 34 confinement by narrowing the current aperture 68. The current aperture 68 is smaller than the optical aperture 25 due to the protrusion 62 within the opening. Annular protrusion 62 may be located in an electric field null, reducing the optical disturbance even more than optimal placement of the thicker layer alone can. Resonant layer 27 is depicted with the bottom layer having a zero thickness.

Also shown in FIG. 4 is a preferred configuration of a top electrode 28 comprising two layers; the bottom layer 66 preferably comprising about 500 Å of titanium and more preferably a minimum of 200 Å of titanium, and a top layer 64 comprising approximately 8,000 Å of gold. The VCSEL 60 functions as described in the first embodiment in that the phase-shifting region 24 and reduces the reflectance of the layers beneath the phase-shifting region 24.

Figure 5:
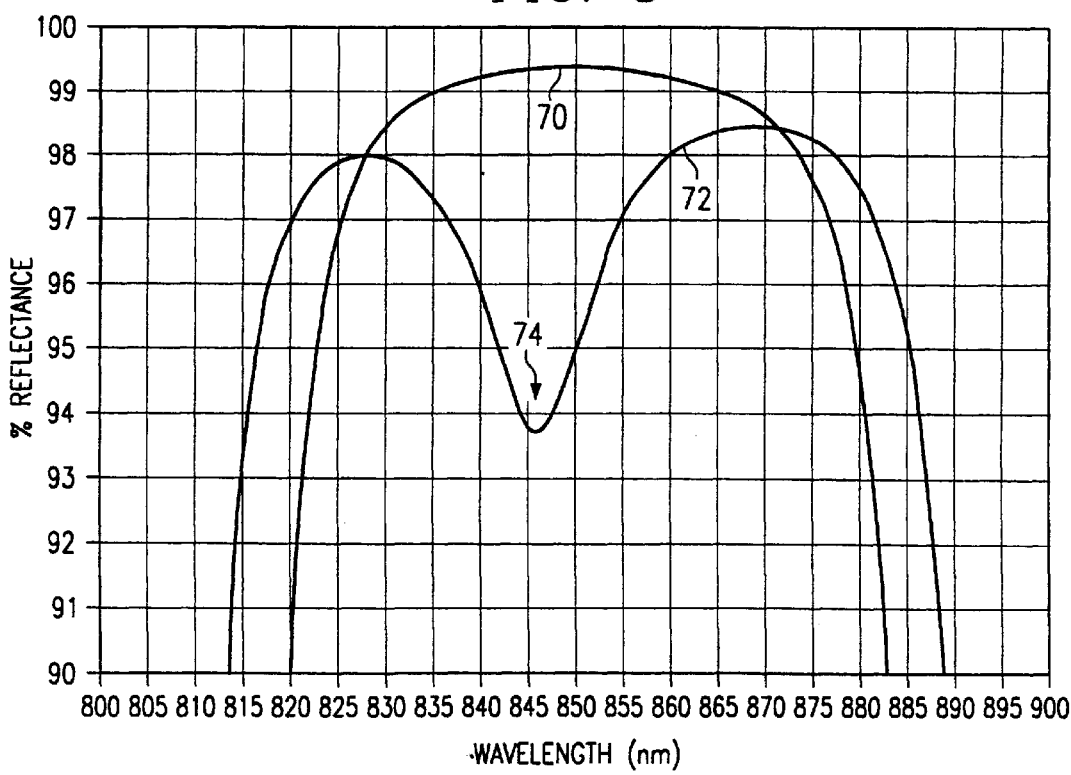
FIG. 5 shows a graph of the reflectivity of the second semiconductor mirror stack with the phase shifting region outside the inner oxidation boundary compared to the reflectivity of the unoxidized mirror inside the oxidation boundary.

FIG. 5 compares the reflectance of the two regions 25 and 35 in the second semiconductor mirror stack 22 of the present invention. The line depicted at 70 illustrates the reflectivity of the top mirror stack 22 as seen from the quantum wells 32 of a VCSEL of the prior art without a phase-shifting region 24, as would be seen within the aperture 25 or 68. The line depicted at 72 illustrates the reflectivity of the top semiconductor mirror stack 22 as seen from the quantum wells 32 with the phase-shifting region 24, outside the aperture. The phase-shifting region 24 creates a dip 74 illustrating a reduction in the reflectivity of the top mirror stack 22 of the present invention at wavelength $\lambda$=846 nm.

Advantages of the invention include reducing the reflectance of the second mirror stack within the phase-shifting region, while causing losses for higher order modes. This results in a high performance VCSEL operable in single mode. Placing the phase-shifting region 24 in the top mirror stack 22 in the position and thickness described herein reduces the reflectance of the top mirror stack 22, bleeding higher order modes from the laser emission 36. The phase-shifting region 24 of the present invention may be created by forming an oxide layer and using single step MOCVD, providing ease of manufacturability and yield improvement. The phase-shifting region 24 of the present invention requires positioning a thick layer greater than a ¼$\lambda$ nominal mirror layer, avoiding complicated regrowth techniques required in the prior art. Excellent single mode operation is achieved with the present invention, by use of a different structure than used in the prior art, while being otherwise optically indistinguishable from other structures. In addition to the enhanced losses, the present invention also creates an antiguide.

Although the invention has been described with respect to specific preferred embodiments, many variations and modifications will become apparent to those skilled in the art upon reading the present application. Although the coupled cavity resonator of the present invention is particularly suitable for use in a VCSEL, its use in other semiconductor lasers is contemplated. The present invention is illustrated herein with the phase-shifting region 24 being positioned within the top mirror stack 22; however, the resonant layer may be positioned within the bottom mirror stack 14, or one resonant layer in both the top mirror stack 22 and the bottom mirror stack 14. Likewise, the phase-shifting region 24 may be used with a top-emitting or bottom-emitting VCSEL. Furthermore, while the preferred embodiments displace the phase-shifting region so that it is one or several mirror periods distant from the optical cavity 29, it is possible to locate the phase-shifting region within the cavity 29, relying on the material refractive index difference to provide enough reflectivity difference to produce the desired coupled-cavity behavior. This invention focuses primarily on single-mode VCSELs, thought the present invention may also be used to improve the spectral properties of multi-mode VCSELs. Furthermore, while one phase-shifting region is shown, it is envisioned that several phase-shifting regions may be disposed in several layers for certain applications. The total phase shift would be a summation of the individual phase shift regions. It is anticipated that the present invention would be beneficial for use in a phased-array as a practical anti-guide structure, with a plurality of laterally displaced but closely associated active elements phased with one another to create a phased array of emitters. It is therefore the intention that the appended claims be interpreted as broadly as possible in view of the prior art to include all such variations and modifications.

We claim:

1. An optical device comprising:

a substrate;

a first mirror stack situated on said substrate;

a first Fabry-Perot cavity situated on said first mirror stack; and a second Fabry-Perot cavity situated on said first Fabry-Perot cavity a second mirror stack; and an active region situated between said first mirror stack and said second mirror stack.

2. The device of claim 1, wherein said second Fabry-Perot cavity comprises:

a first portion of a second mirror stack situated on said first Fabry-Perot cavity;

a resonant layer situated on the first portion of said second mirror stack; and a second portion of said second mirror stack situated on the resonant layer.

3. The device of claim 2, wherein the resonant layer comprises:

an aperture having a perimeter; and a phase-shifting region beyond and defining the perimeter of the aperture.

4. The device of claim 3, wherein said first and second mirror stacks are distributed Bragg reflectors (DBRs).

5. The device of claim 4, wherein the phase shifting region has a refractive index that is less than a refractive index of the aperture.

6. The device of 5, wherein said first and second Fabry-Perot cavities are coupled with each other.

7. The device of claim 6, wherein the refractive indexes of the phase shifting region and the aperture have values such that reflectivity of said second mirror stack proximate to the phase shifting region is reduced so as to increases losses of higher order modes of light from the active region and improve efficiency of single mode emission of the light.

8. The device of claim 7, wherein a reflectivity contrast between said second mirror stack proximate to the phase shifting region and said second mirror stack proximate to the aperture results in the optical device being a coupled-cavity anti-guiding device.

9. The device of claim 8, wherein the phase shifting region has at least one protrusion extending into the aperture to result in a current aperture smaller that an optical aperture of the aperture.

10. The device of claim 9, wherein a thickness of the at least one protrusion is less than a thickness of the phase shifting region.

11. A plurality of optical devices, wherein each optical device comprises:

a substrate;

a first mirror stack situated on said substrate;

a first Fabry-Perot cavity situated on said first mirror stack; and a second Fabry-Perot cavity situated on said first Fabry-Perot cavity a second mirror stack; and an active region situated between said first mirror stack and said second mirror stack.

12. The plurality of optical devices of claim 11, wherein said second Fabry-Perot cavity of each device comprises:

a first portion of a second mirror stack situated on said first Fabry-Perot cavity;

a resonant layer situated on the first portion of said second mirror stack; and a second portion of said second mirror stack situated on the resonant layer.

13. The plurality of devices of claim 12, wherein the resonant layer of each device comprises:

an aperture having a perimeter; and a phase-shifting region beyond and defining the perimeter of the aperture.

14. The plurality of devices of claim 13, wherein said first and second mirror stacks of each device are distributed Bragg reflectors (DBRs).

15. The plurality of devices of claim 14, wherein the phase shifting region of each device has a refractive index that is less than a refractive index of the aperture.

16. The plurality of devices of claim 15, wherein said first and second Fabry-Perot cavities of each device are coupled with each other.

17. The plurality of devices of claim 16, wherein the refractive indexes of the phase shifting region and the aperture of each device have values such that reflectivity of said second mirror stack proximate to the phase shifting region is reduced so as to increases losses of higher order modes of light from the active region and improve efficiency of single mode emission of the light.

18. The plurality of devices of claim 17, wherein a reflectivity contrast between said second mirror stack proximate to the phase shifting region and said second mirror stack proximate to the aperture of each device results in each optical device being a coupled-cavity anti-guiding device.

19. The plurality of devices of claim 18, wherein the phase shifting region of each device has at least one protrusion extending into the aperture to result in a current aperture smaller that an optical aperture of the aperture.

20. The plurality of devices of claim 19, wherein a thickness of the at least one protrusion within the aperture each device is less than a thickness of the phase shifting region.

21. The plurality of devices of claim 20, wherein the plurality of devices is situated on one substrate.

22. The plurality of devices of claim 21, there the plurality of optical devices form a phased-array.

23. A method for making an optical device, comprising:

forming a first semiconductor mirror stack on a substrate;

forming a first spacer on the first semiconductor mirror stack;

forming an active region on the first spacer;

forming a second spacer on the active region;

forming a first portion of a second semiconductor mirror stack on the active region;

forming a layer having an aperture surrounded by phase shifting region on the first portion of the second semiconductor mirror stack;

forming protrusions from the phase shifting region into the aperture; and forming a second portion of the second semiconductor mirror stack on the layer; and wherein the forming is performed with a single step of metal organic chemical vapor deposition (MOCVD) combined with an oxidization step.

24. A method for forming a plurality of optical devices on a common substrate, comprising:

forming a first semiconductor mirror stack for each device on the substrate;

forming a first spacer for each device on the first semiconductor mirror stack;

forming an active region for each device on the first spacer;

forming a second spacer for each device on the active region;

forming a first portion of a second semiconductor mirror stack for each device on the active region;

forming a layer having an aperture surrounded by phase shifting region for each device on the first portion of the second semiconductor mirror stack;

forming protrusions from the phase shifting region into the aperture for each device; and forming a second portion of the second semiconductor mirror stack for each device on the layer; and wherein the forming is performed with a single step of metal organic chemical vapor deposition (MOCVD) combined with an oxidization step.

25. The method of claim 24, comprising forming the phase shifting region having particular properties for each device with the oxidation step so as to make the plurality of optical devices into a phased array on the common substrate.

26. A method for making an optical device, comprising:

forming a first mirror stack situated on a substrate;

forming a first Fabry-Perot cavity situated on said first mirror stack; and forming a second Fabry-Perot cavity situated on said first Fabry-Perot cavity; and forming a second mirror stack; and forming an active region between said first mirror stack and said second mirror stack wherein one MOCVD step is used.

* * * * *

UNITED STATES PATENT AND TRADEMARK OFFICE
CERTIFICATE OF CORRECTION

PATENT NO. : 6,678,300 B2  Page 1 of 2
APPLICATION NO. : 10/147136
DATED : January 13, 2004
INVENTOR(S) : Johnson et al.

It is certified that error appears in the above-identified patent and that said Letters Patent is hereby corrected as shown below:

Cover Page,
Item (75), under "Inventors:" change "James Gunter" to --James Guenter--
Item [56] Other. pub. after "PCT International" referenc change "Serach" to --Search--

Column 2,
Line 61, before "Anti-guide" change "small" to --small.--

Column 5,
Line 64, before "In the embodiment" change "therefrom" to --therefrom.--

Column 6,
Line 35, change "region 24 region," to --region 24,--

Column 9,
Line 22, after "phase-shifting region 24" remove [and]

Column 10,
Line 10, after "VCSELs," change "thought" to --though--
Line 60, after "so as to" change "increases" to --increase--

Column 11,
Line 3, change "smaller that" to --smaller than--
Line 47, after "so as to" change "increases" to --increase--
Line 58, change "smaller that" to --smaller than--

UNITED STATES PATENT AND TRADEMARK OFFICE
CERTIFICATE OF CORRECTION

PATENT NO.         : 6,678,300 B2
APPLICATION NO.    : 10/147136
DATED              : January 13, 2004
INVENTOR(S)        : Johnson et al.

It is certified that error appears in the above-identified patent and that said Letters Patent is hereby corrected as shown below:

Column 12,
Line 1, change "there" to --where--

Signed and Sealed this

Twenty-second Day of August, 2006

JON W. DUDAS
*Director of the United States Patent and Trademark Office*